US009478978B1

United States Patent
Fu et al.

(10) Patent No.: US 9,478,978 B1
(45) Date of Patent: *Oct. 25, 2016

(54) SHORT CIRCUITS AND POWER LIMIT PROTECTION CIRCUITS

(71) Applicant: IML International, Grand Cayman (KY)

(72) Inventors: Chia-Te Fu, Hsinchu (TW); Sintiat Te, San Jose, CA (US); Chiayao S. Tung, Cupertino, CA (US)

(73) Assignee: IML International, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/734,461

(22) Filed: Jun. 9, 2015

Related U.S. Application Data

(63) Continuation of application No. 13/827,078, filed on Mar. 14, 2013, now Pat. No. 9,054,527.

(51) Int. Cl.
| | |
|---|---|
| *H02H 9/08* | (2006.01) |
| *H02H 9/02* | (2006.01) |
| *H02M 1/32* | (2007.01) |
| *H02M 1/00* | (2006.01) |
| *H03F 1/52* | (2006.01) |

(52) U.S. Cl.
CPC ............ *H02H 9/025* (2013.01); *H02M 1/32* (2013.01); *H02M 2001/0009* (2013.01); *H03F 1/52* (2013.01); *H03F 1/523* (2013.01)

(58) Field of Classification Search
USPC ................................ 361/93.7–93.9; 330/298
See application file for complete search history.

(56) References Cited

U.S. PATENT DOCUMENTS

| | | | |
|---|---|---|---|
| 4,709,216 A | 11/1987 | Davis | |
| 5,384,549 A | 1/1995 | Araki | |
| 6,952,091 B2 | 10/2005 | Bansal | |
| 7,075,373 B2 | 7/2006 | Briskin et al. | |
| 7,345,542 B2 | 3/2008 | Dashtestani et al. | |
| 7,557,660 B2 | 7/2009 | Tsurumi | |
| 8,154,346 B2 | 4/2012 | Tung | |
| 9,054,527 B1 * | 6/2015 | Fu | H03F 1/523 |
| 2009/0002072 A1 | 1/2009 | Tsurumi | |
| 2010/0085025 A1 | 4/2010 | Kato | |
| 2011/0115564 A1 | 5/2011 | Tung | |

* cited by examiner

*Primary Examiner* — Danny Nguyen
(74) *Attorney, Agent, or Firm* — Aka Chan LLP

(57) ABSTRACT

A method includes: detecting one of a short-to-ground condition and a short-to-supply condition at an output node; after a delay, selectively activating a feedback control transistor according to the detecting; detecting a first current passing through a first transistor using a second transistor sized to be smaller than the first transistor; mirroring the detected current using a plurality of transistors to form a feedback current; and providing the feedback current to a gate electrode of the first transistor according to the selectively activating the feedback control transistor.

42 Claims, 12 Drawing Sheets

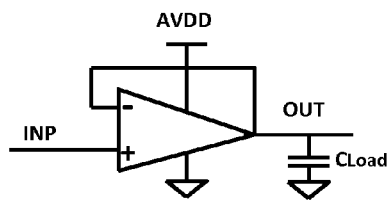
Figure 6A
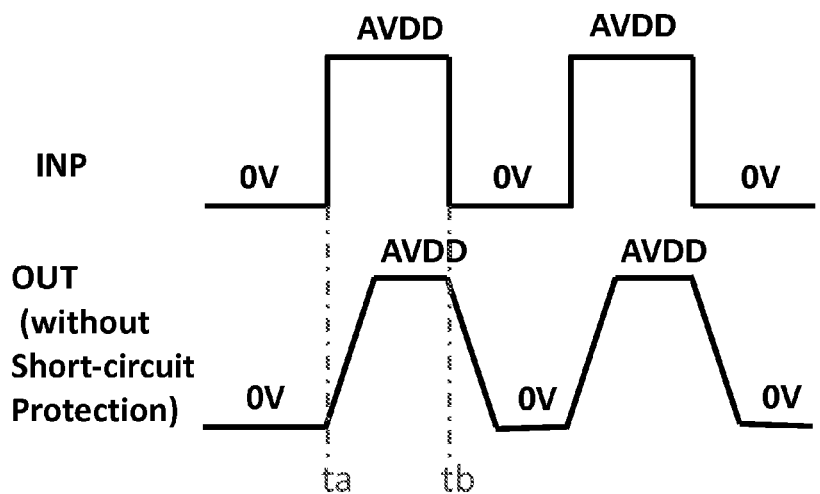
Figure 6B
Figure 6C
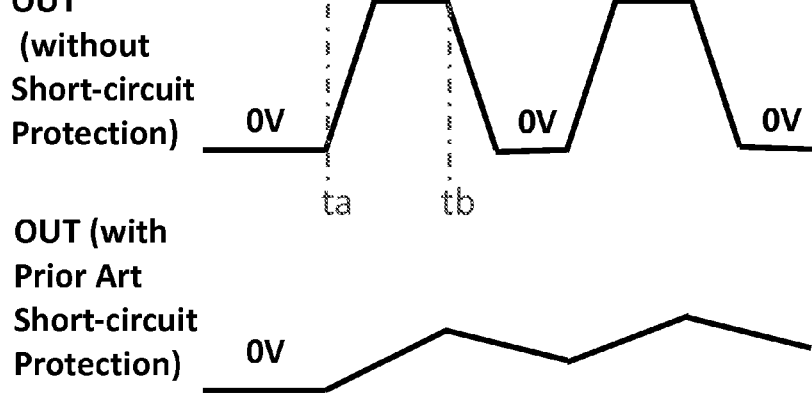
Figure 6D
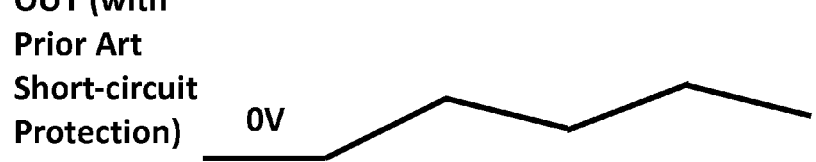
For OPAMP without short circuit protection
At t=ta, OPAMP acts like shorted to ground
At t= tb, OPAMP acts like shorted to AVDD Figure 7A
Figure 7B
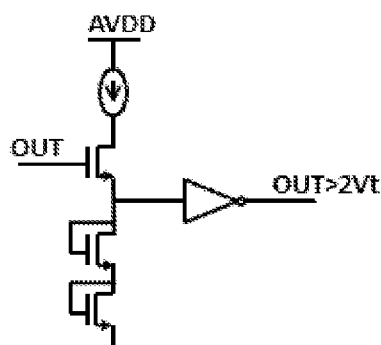
Block1a : Output Detection
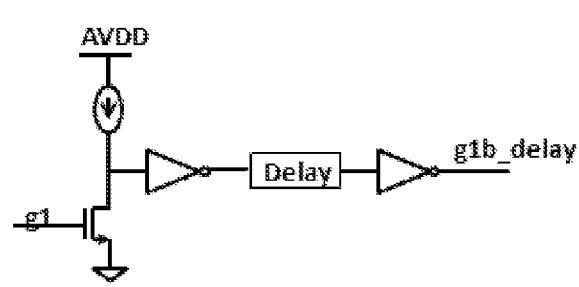
Block2a : Driver Gate Detection
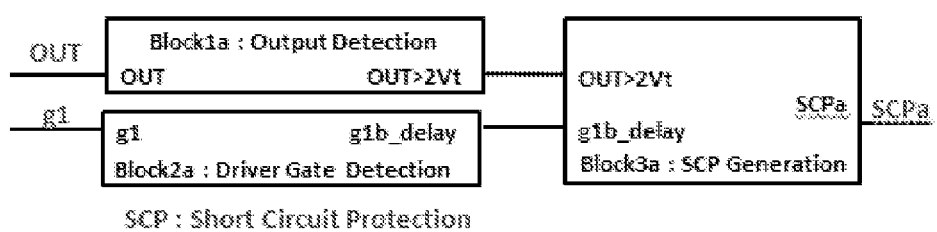
SCP : Short Circuit Protection
The Control of Short Protection Circuit when output is shorted to ground
Figure 7C Figure 8A
Figure 8B
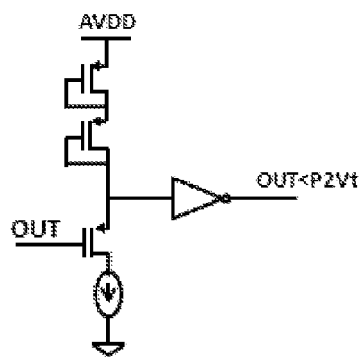
Block1b : Output Detection
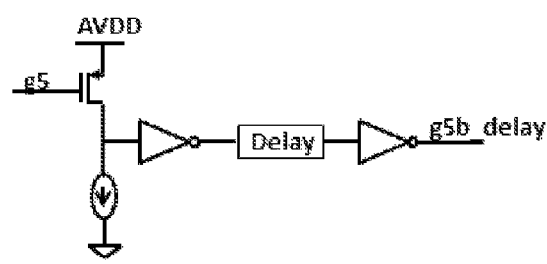
Block2b : Driver Gate Detection
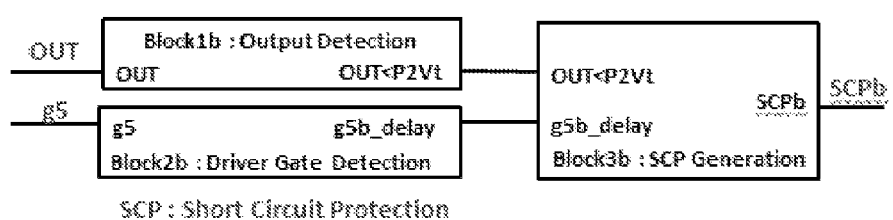
SCP : Short Circuit Protection
The Control of Short Protection Circuit when output is shorted to power (AVDD)
Figure 8C Figure 9A
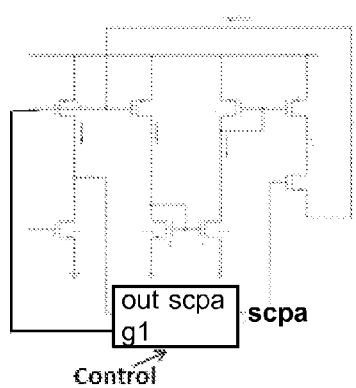
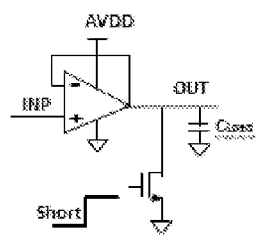
Output Really Shorted to Ground
Figure 9B
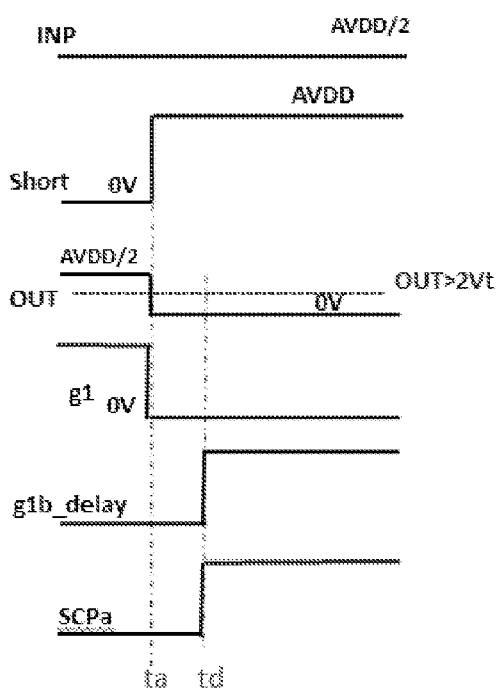
Output is shorted to ground
Figure 9C Figure 10A
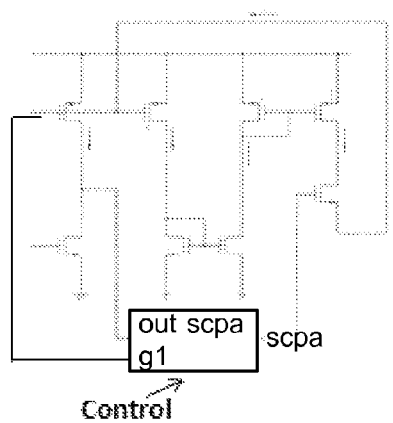
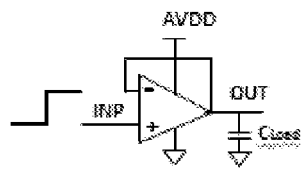
Input Step Response (Slew Rate)
Normal Circuit Operation
Short Circuit Like Operation
Figure 10B
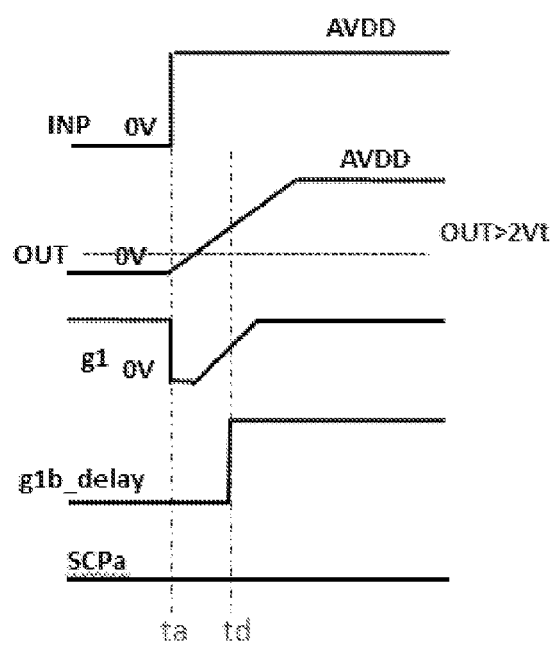
Slew Rate from 0V to Power AVDD
Figure 10C Figure 11A
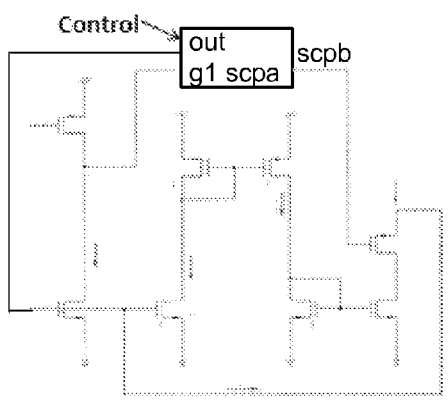
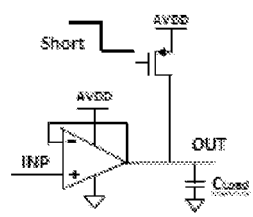
Output Really Shorted to AVDD
Figure 11B
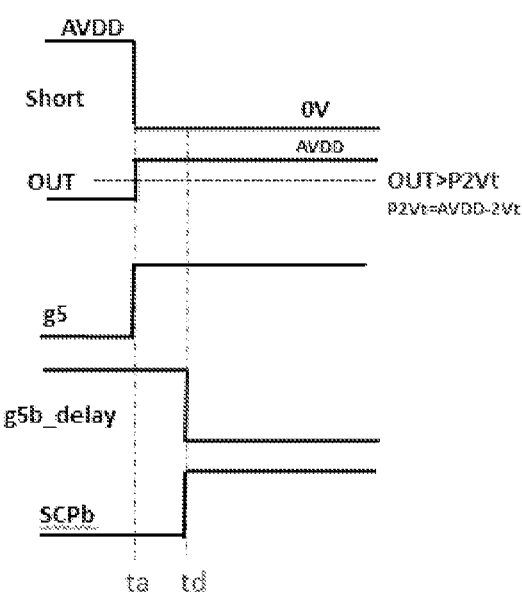
Output is shorted to AVDD
Figure 11C Figure 12A
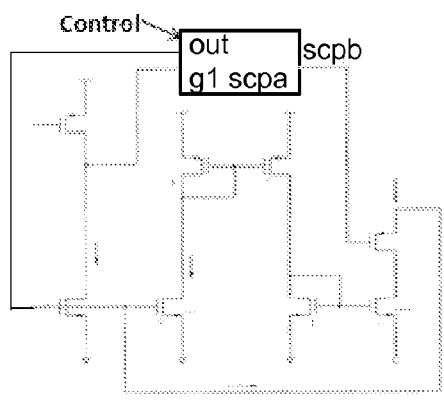
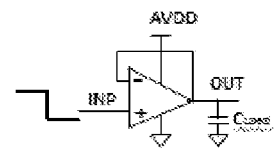
Input Step Response
Real Circuit Operation
Short Circuit Like Operation
Figure 12B
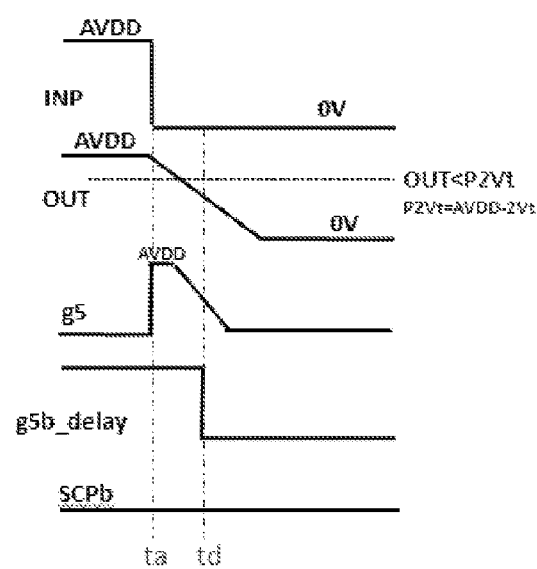
Slew Rate from Power AVDD to 0V
Figure 12C

SHORT CIRCUITS AND POWER LIMIT PROTECTION CIRCUITS

CROSS-REFERENCE TO RELATED APPLICATIONS

This patent application is a continuation of U.S. patent application Ser. No. 13/827,078, filed Mar. 14, 2013, issued as U.S. Pat. No. 9,054,527 on Jun. 9, 2015, which is incorporated by reference along with all other references cited in this application.

BACKGROUND OF THE INVENTION

This invention relates to protection circuits, and more particularly, to short circuit and power limit protection circuits used, for example, with output stages.

Many electronic circuits use amplifiers or buffers (e.g., unity gain amplifiers) to manipulate or maintain various signals within the circuit. The output of an amplifier or buffer stage is typically connected to provide an output voltage to a load circuit, or to provide circuit isolation via the stage's high input impedance and low output impedance. The design of an output stage may affect various operating aspects of the amplifier or buffer. For example, some amplifiers can deliver a high output current to the load, while others are designed to produce an output voltage swing approximately equal to the magnitude of the circuit's power supply. In other examples, amplifiers are designed to provide output signals with low crossover distortion. In still other examples, amplifiers must maintain gain and stability at relatively high frequencies.

The various operational requirements place constraints upon the design of the output stage. One of the most common output stage designs is that of the class AB amplifier. These output stages are used in a variety of applications including, for example, audio amplifiers and flat-panel display driver circuits. FIG. 1 illustrates a prior art class AB output stage. The output stage of class-AB amplifiers operates by using a current source and a current sink, here complimentary MOSFET transistors $M_1$ and $M_5$. This configuration is sometimes referred to as a "push-pull" configuration since a first branch of the output stage pushes or sources currents to a load while a second branch of the output stage pulls or sinks current from the load. Class-AB amplifiers avoid the high power consumption of a class-A amplifier by always having one output branch substantially turn off when the other output branch is turned on.

The input signal to this stage is applied at nodes $g_1$ and $g_5$, where the signal values rise and fall in the same direction, i.e., the nodes are the same phase. If the output node is accidentally shorted to ground, PMOS transistor $M_1$ sources a great deal of current while NMOS transistor $M_5$ turns off. If, instead, the output node is shorted to the power supply rail $V_{DD}$, NMOS transistor $M_5$ sinks a great deal of current and PMOS transistor $M_1$ turns off. Such shorts can damage or destroy the output stage itself, and/or other circuitry associated with the output stage. Although shorts to $V_{DD}$ or ground are not common during normal operation of the circuit, they can occur during manufacture or testing of devices using the circuit, such as flat-panel displays including one or more integrated circuits with such output stages.

Accordingly, it is desirable to have protection circuitry for output stages such as the class AB output stage of FIG. 1, thereby reducing the likelihood that the circuit is damaged because an output node is shorted to ground or to the power rail.

BRIEF SUMMARY OF THE INVENTION

According to one embodiment, a circuit comprises a control circuit configured to detect one or more of a short-to-ground condition or a short-to-supply condition at an output node. A first transistor, coupled to the control circuit and controlled by the control circuit, selectively applies a feedback current to a gate electrode of a second transistor. A third transistor, having a gate electrode coupled to the gate electrode of the second transistor, is configured to detect a detected current flowing through the second transistor. A current mirror, coupled to the first transistor and the third transistor, produces the feedback current based on the detected current. The control circuit includes: a fourth transistor having a gate node coupled the gate electrode of the second transistor; a first inverter, coupled to a source node of the fourth transistor; a delay element, coupled to the first inverter; and a second inverter, coupled between the delay element and the first transistor.

In some embodiments, the control circuit includes at least two diode-connected transistors coupled to a third inverter. In some embodiments, the control circuit includes a control transistor having a gate electrode coupled to the output node, and the control transistor is coupled to the at least two diode-connected transistors.

In some embodiments, the second transistor has a second transistor width to length (w/l) ratio, the third transistor has a third transistor w/l ratio, and the second transistor w/l ratio is greater than the third transistor w/l ratio.

In some embodiments, the current mirror includes a plurality of transistors, the third transistor has a third transistor w/l ratio, and at least one of the plurality of transistors has a transistor w/l ratio the same as the third transistor w/l ratio.

In some embodiments, the current mirror includes a plurality of transistors, the second transistor has a second transistor w/l ratio, and at least one of the plurality of transistors has a transistor w/l ratio greater than the second transistor w/l ratio.

In some embodiments, the second transistor is a PMOS transistor coupled between a power supply and the output node. The feedback current increases a voltage on the gate electrode of the second transistor when the short-to-ground condition occurs at the output node.

In some embodiments, the second transistor is an NMOS transistor coupled between the output node and ground. The feedback current decreases a voltage on the gate electrode of the second transistor when the short-to-supply condition occurs at the output node.

In some embodiments, the circuit further comprises a protected circuit including the second transistor. The protected circuit, the control circuit, the first transistor, the third transistor, and the current mirror are each included in a same integrated circuit. In some embodiment, the protected circuit further comprises a class AB output stage.

In some embodiments, the circuit further comprises a fifth transistor coupled in parallel with the third transistor and configured to provide a supply-dependent current. The current mirror produces the feedback current based on the detected current and the supply-dependent current. In some embodiments, the second transistor is a PMOS transistor coupled between a power supply and the output node. The feedback current increases a voltage on the gate electrode of the second transistor when the short-to-ground condition occurs at the output node to provide power limit protection to the second transistor.

In some embodiments, the second transistor is an NMOS transistor coupled between the output node and ground. The feedback current decreases a voltage on the gate electrode of the second transistor when the short-to-supply condition occurs at the output node to provide power limit protection to the second transistor.

According to another embodiment, a method comprises: detecting one of a short-to-ground condition and a short-to-supply condition at an output node; after a delay (e.g. caused by a delay circuit), selectively activating a feedback control transistor according to the detecting; detecting a first current passing through a first transistor using a second transistor sized to be smaller than the first transistor; mirroring the detected current using a plurality of transistors to form a feedback current; and providing the feedback current to a gate electrode of the first transistor according to the selectively activating the feedback control transistor.

In some embodiments, the detecting comprises detecting a short-to-ground condition at the output node and wherein the first transistor is a PMOS transistor coupled between a supply rail and the output node. The method further comprises charging the gate electrode of the first transistor according to the feedback current.

In some embodiments, the detecting comprises detecting a short-to-supply condition at the output node and wherein the first transistor is an NMOS transistor coupled between the output node and ground. The method further comprises discharging the gate electrode of the first transistor according to the feedback current.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 6A-6D show an operational amplifier buffer and timing diagrams.

FIG. 7A-7C show a short-circuit protection circuit for an NMOS driver of an operational amplifier.

FIG. 8A-8C show a short-circuit protection circuit for a PMOS driver of an operational amplifier.

FIGS. 9A-9C show operation of the short-circuit protection circuit when the output is shorted to ground for the NMOS driver.

FIGS. 10A-10C show normal operation condition of the short-circuit protection circuit for the NMOS driver.

FIGS. 11A-11C show operation of the short-circuit protection circuit when the output is shorted to power for the PMOS driver.

FIGS. 12A-12C show normal operation condition of the short-circuit protection circuit for the PMOS driver.

DETAILED DESCRIPTION OF THE INVENTION

Although many of the examples described in the present application will emphasize use in conjunction with class AB output stages, it will be understood by those skilled in the art that these circuits can be used with a variety of output stage designs as desired. Moreover, the protection circuits disclosed herein can be used with both buffering and amplifying output stages, and can be applied wherever such output stages are used including both integrated circuits and discrete circuit designs. Additionally, the present application describes various circuits designed to be integrated with other circuits. Thus, for example, the protection circuits described below are designed to be integrated with the output stage circuits they are used to protect, e.g., flat panel display drivers, and the like.

The circuits of the present application can therefore be implemented using any of a variety of integrated circuit fabrication processes that are suitable for the underlying device. Examples of such integrated circuit fabrication processes include, but are not limited to, BCD (bipolar, CMOS, DMOS) processes, digital CMOS processes, analog CMOS processes, and mixed-signal CMOS processes. BCD processes incorporate, into a single foundry process flow, what are typically three different process types: bipolar, which is used for analog control devices, CMOS (Complementary Metal Oxide Semiconductor) which forms devices that are suitable for the design of both digital and analog circuits, and DMOS (Double Diffused MOS) which is used to form devices that are appropriate for high current output. Similarly, the related BiCMOS foundry process integrates manufacturing technology for forming bipolar devices and CMOS devices on a single die, and can also be used. Numerous other commercial and specialized processes exist that can be used to fabricate one or more of the die. Examples include CMOS variations such as high voltage CMOS, RF CMOS, SiGe BiCMOS, radiation hardened processes, GaAs specific processes, and the like. Thus, although the circuit examples shown in FIGS. 1-5 rely on CMOS circuit design, the protection circuits can generally be implemented in any of a number of integrated circuit processes.

U.S. Pat. No. 8,154,346, issued Apr. 10, 2012, and U.S. patent application 61/259,096, filed Nov. 6, 2009, are incorporated by reference along with all other references cited in this application.

Figure 1:
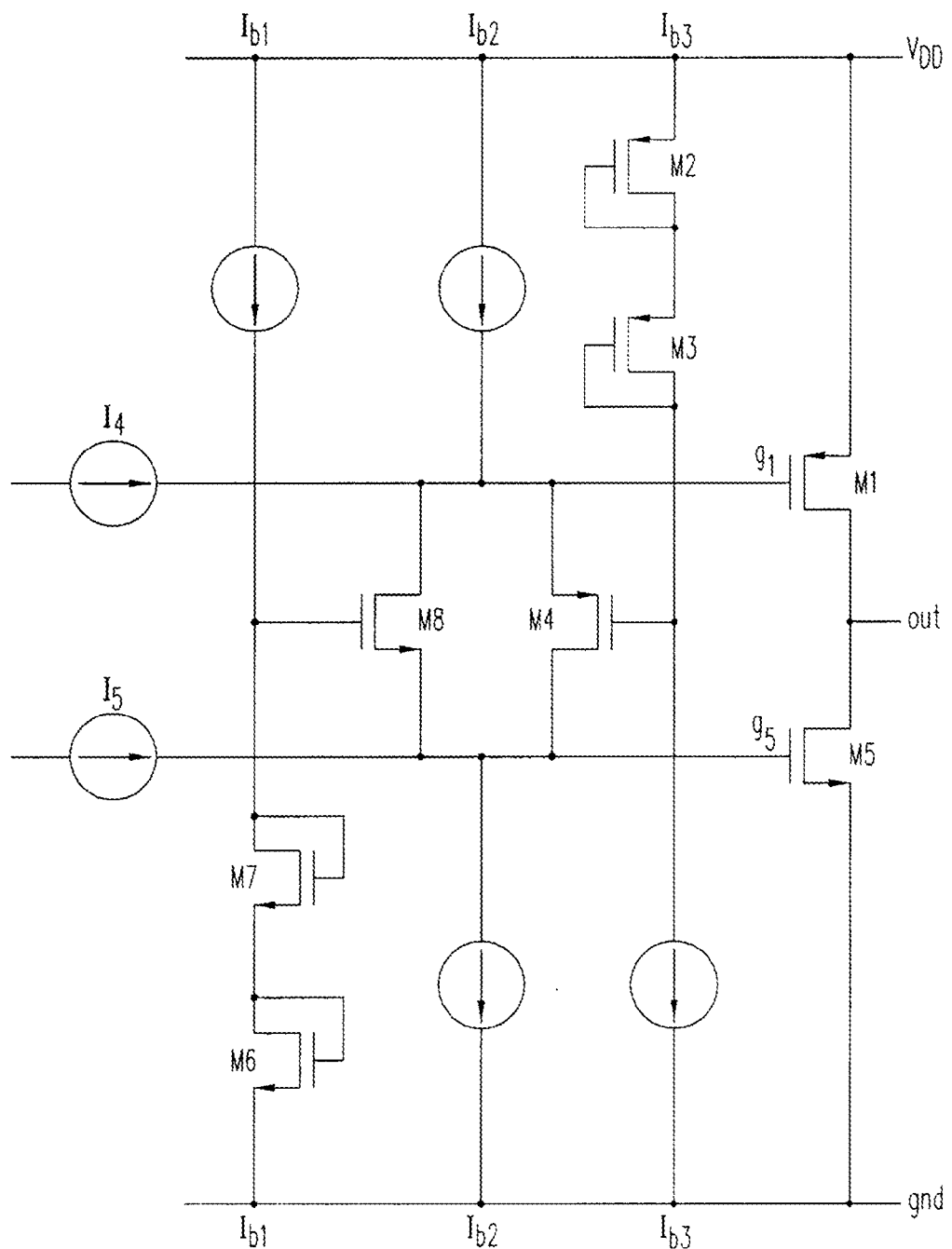
FIG. 1 is a schematic diagram of a prior art class AB output stage.
Figure 2:
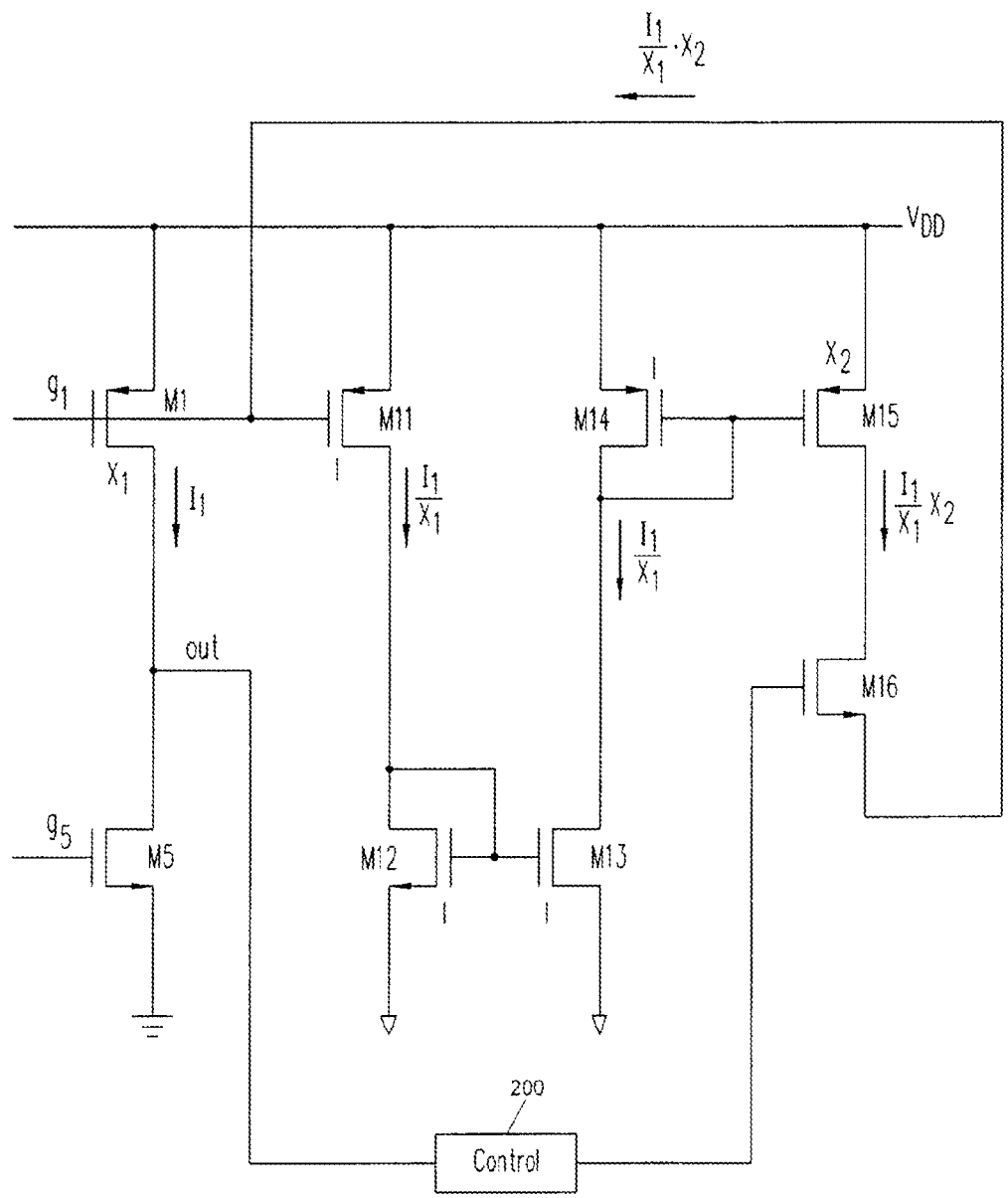
FIG. 2 is a schematic diagram illustrating an example of a current limiting protection circuit for use with the circuit of FIG. 1.

FIG. 2 is a schematic diagram illustrating an example of a current limiting protection circuit for use with the circuit of FIG. 1. Here, a current limit protection circuit for PMOS transistor M1 is shown. Since the circuit of FIG. 2 is designed for current limit protection of PMOS transistor M1, the circuit is primarily designed to detect when the output node is shorted to ground, thereby causing PMOS transistor M1 to source undesirably high amounts of current. The current limit protection circuit includes control circuit 200 for determining when to activate the protection circuit.

In the simplest example, control circuit 200 is an inverter (not shown). Consequently, when the output voltage is at or near zero because of a short to ground, control circuit 200 produces a voltage high enough to turn on NMOS transistor M16, thereby allowing the current developed by the protection circuit to flow back to node $g_1$, i.e., the gate of PMOS transistor M1. In still another example, control circuit 200 includes a PMOS transistor with its gate coupled to the output node, and having its drain coupled to the gate of NMOS transistor M16 and a current source (not shown). When the voltage of the output drops to ground, or at least below the threshold voltage of the added PMOS transistor, the PMOS transistor turns on to force the gate of NMOS transistor M16 to a voltage high enough to turn on NMOS transistor M16.

In general, numerous control circuits 200 can be implemented. Moreover, the control circuits can be designed to have different trip points (e.g., zero volts, $V_T$, and so others), depending on the needs of the protection circuit.

While in operation, the protection circuit of FIG. 2 uses a current mirror to detect the output current $I_1$ flowing through PMOS transistor M1 into the output node. PMOS transistor M11 detects output current $I_1$ and is typically designed to have a smaller gate width and gate length ratio (w/l) than that of PMOS transistor M1. As shown, the size ratio of the two transistors is represented by $X_1$. Thus, $(w/l)_{M1}/(w/l)_{M11}$ is $X_1$, and therefore when output current $I_1$ flows through PMOS transistor M1, the current detected in PMOS transistor M11 is $I_1/X_1$. As will be known to those skilled in the art, the characteristics and performance of many circuits can be designed by changing the sizes (length and width) of the MOSFETs used. Consequently, various different ratios $X_1$ can be used. In one example, $X_1$ is approximately 20,000 such that an output current $I_1$ of 500 milliamps produces a detected current $I_1/X_1$ of approximately 25 microamps. This reduction in current value helps to ensure that the protection circuit is not damaged by high currents. Moreover, it can also result from the desire to fabricate a small protection circuit (e.g., small as compared to other main circuit components) that consumes little power.

Transistors M12-M15 are current mirror transistors used to further develop the current that will be supplied back to the gate of PMOS transistor M1 to adjust its operation in a short-to-ground condition. Again, the respective sizes of the transistors are selected depending on desired circuit operation. In the example of FIG. 2, transistors M11-M14 are designed to have the same size, i.e., w/l ratio. Thus, current flow through PMOS transistor M14 is the same as that flowing through PMOS transistor M11, i.e., $I_1/X_1$. The size of PMOS transistor M15 is selected with respect to the size of PMOS transistor M14 to further develop the feedback current. As illustrated, the ratio $(w/l)_{M15}/(w/l)_{M14}$ is $X_2$, and the feedback current is therefore $(I_1/X_1)X_2$. In some examples, the sizes of transistors M11-M15 are chosen so that $X_2$ is approximately 2 or 3, but various different relative transistor sizes can be chosen based on design considerations as is well known in the art.

Accordingly, when PMOS transistor M11 detects a higher output current $I_1$, a higher charging feedback current is fed back to node $g_1$ (i.e., the gate of PMOS transistor M1) by the protection circuit, thereby clamping the output node and forcing PMOS transistor M1 to source less current. The short circuit current limit can be adjusted by careful selection, for example, of the size of PMOS transistor M15.

Figure 3:
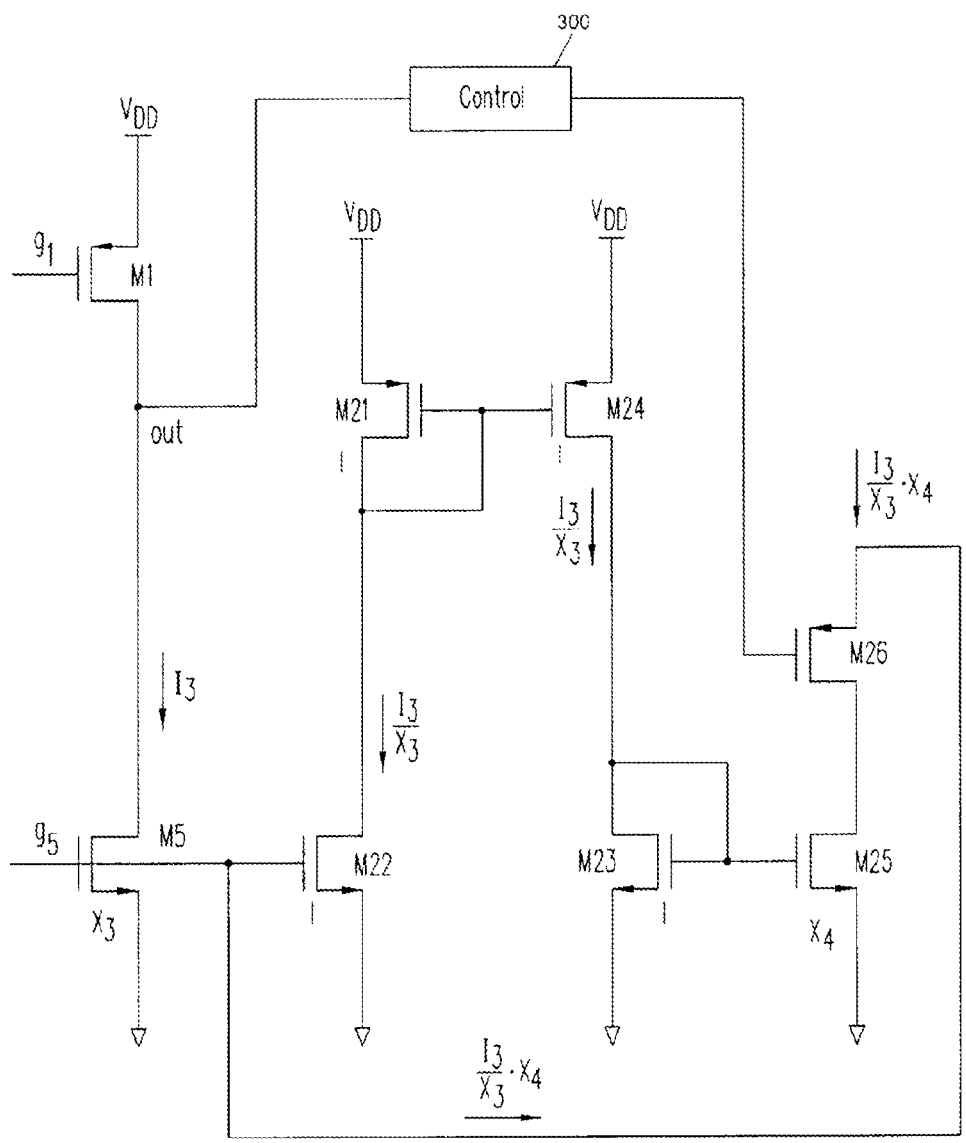
FIG. 3 is a schematic diagram illustrating another example of a current limiting protection circuit for use with the circuit of FIG. 1.

FIG. 3 is a schematic diagram illustrating an example of a current limiting protection circuit for use with the circuit of FIG. 1. Here, a current limit protection circuit for NMOS transistor M5 is shown. Since the circuit of FIG. 3 is designed for current limit protection of NMOS transistor M5, the circuit is primarily designed to detect when the output node is shorted to the power supply rail $V_{DD}$, thereby causing NMOS transistor M5 to sink undesirably high amounts of current. The current limit protection circuit of FIG. 3 includes control circuit 300 for determining when to activate the protection circuit.

Operation of control circuit 300 is somewhat similar to that of control circuit 200, except that control circuit 300 is triggered by a high voltage at the output node (e.g., $V_{DD}$) rather than a low voltage. In the simplest example, control circuit 300 is an inverter (not shown). Consequently, when the output voltage is at or near $V_{DD}$ because of a short to the power supply rail, control circuit 300 produces a voltage low enough to turn on PMOS transistor M26, thereby allowing the current to flow through NMOS transistor M25, discharging node $g_5$ and driving its voltage lower to cause NMOS transistor M5 to sink less current. In still another example, control circuit 300 includes a PMOS transistor with its gate coupled to the output node, and having its source coupled to the gate of PMOS transistor M26 and a current source (not shown). When the voltage of the output node rises to $V_{DD}$, the PMOS transistor turns off to force the gate of PMOS transistor M26 to a voltage low enough to turn on PMOS transistor M26. Numerous other control circuits 300 can be implemented depending on desired trip points, protection needs, and the like.

The protection circuit of FIG. 3 uses NMOS transistor M22 to detect the sink current $I_3$ flowing through NMOS transistor M5 due to the output node short to power supply rail. NMOS transistor M22 detects output current $I_3$ and is typically designed to have a smaller gate width and gate length ratio (w/l) than that of NMOS transistor M5. As shown, the size ratio of the two transistors is represented by $X_3$. Thus, $(w/l)_{M5}/(w/l)_{M22}$ is $X_3$, and therefore when sink current $I_3$ flows through NMOS transistor M5, the current detected in NMOS transistor M22 is $I_3/X_3$. As is the case with the transistors in FIG. 2, characteristics and performance of many circuits can be designed by changing the sizes of the MOSFETs used, and various different ratios $X_3$ can be implemented. In one example, $X_3$ is approximately 20,000 such that a sink current $I_3$ of 500 milliamps produces a detected current $I_3/X_3$ of approximately 25 microamps. This reduction in current value helps to ensure that the protection circuit is not damaged by high currents. Moreover, it can also result from the desire to fabricate a small protection circuit (e.g., small as compared to other main circuit components) that consumes little power. Numerous other examples will be understood by those skilled in the art.

Transistors M21 and M23-M25 are current mirror transistors used to further develop the current used to control the gate of NMOS transistor M5 to adjust its operation in a short-to-supply condition. The respective sizes of the transistors are selected depending on desired circuit operation. In the example of FIG. 3, transistors M21-M24 are designed to have the same size, i.e., w/l ratio. Current flow through PMOS transistor M24 is the same as that flowing through NMOS transistor M22, i.e., $I_3/X_3$. The size of NMOS transistor M25 is selected with respect to the size of transistors M21-M24 to further develop the feedback current. As illustrated, the ratio $(w/l)_{M25}/(w/l)_{M23}$ is $X_4$, and the feedback current is therefore $(I_3/X_3)X_4$. In some examples, the sizes of transistors M21-M25 are chosen so that $X_4$ is approximately 2 or 3, but various different relative transistor sizes can be chosen based on design considerations as is well known in the art.

When NMOS transistor M22 detects a higher sink current $I_3$, the current drawn through transistors M25 and M26 increases, thereby pulling node $g_5$ lower to turn off NMOS transistor M5 to prevent it from sinking too much current.

The short circuit current limit can be adjusted by careful selection, for example, of the size of NMOS transistor M25.

Figure 4:
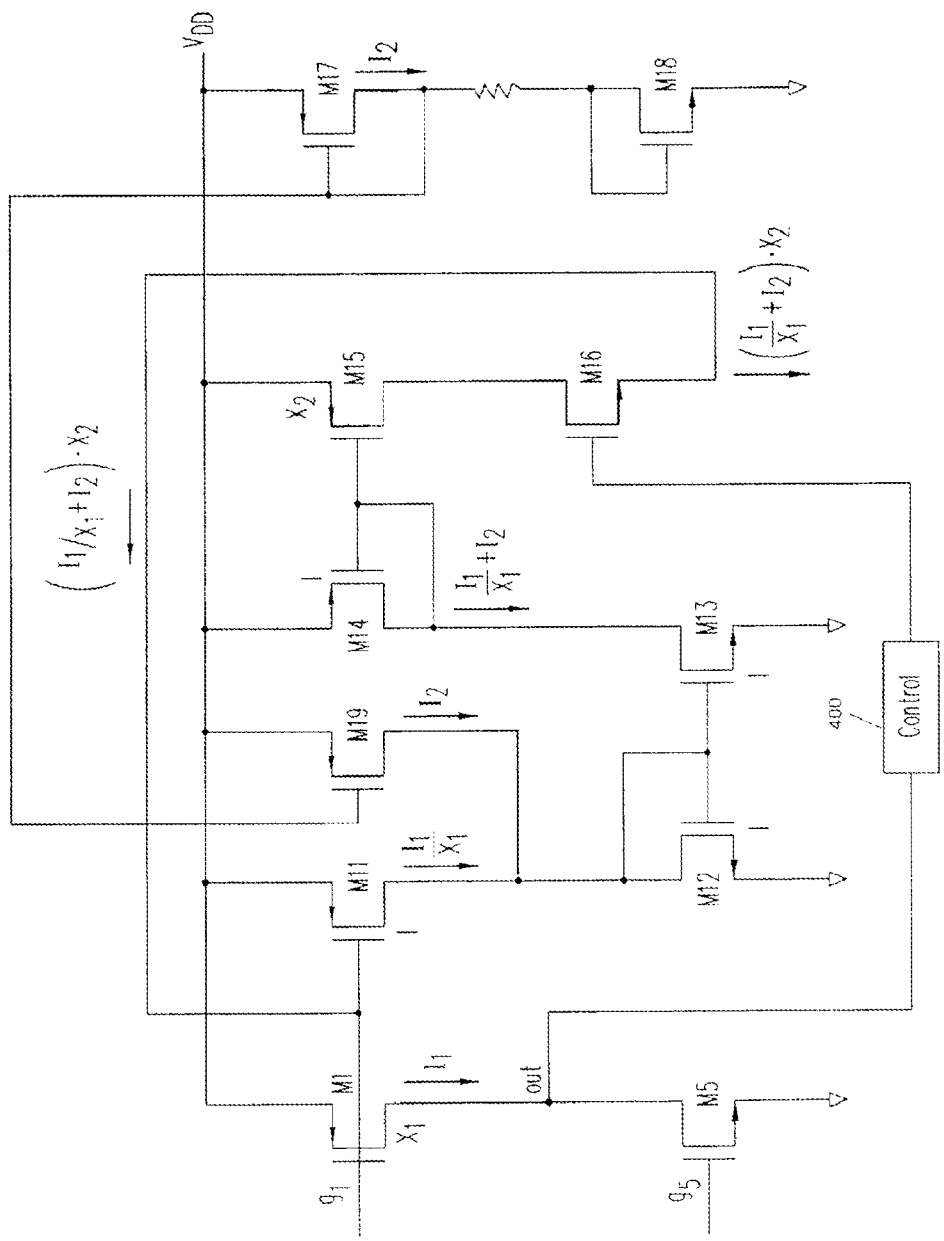
FIG. 4 is a schematic diagram illustrating an example of a power limiting protection circuit for use with the circuit of FIG. 1.

FIG. 4 illustrates an additional protection circuit based on the circuit design of FIG. 2. As with the protection circuit of FIG. 2, this circuit is designed to provide circuit protection in the event the output node shorts to ground. However, instead of providing current limiting protection, the circuit of FIG. 4 is a power limit circuit for protecting PMOS transistor M1, and potentially other circuit components that might be damaged from the high heat associated with an unplanned spike in power consumption. Power limit protection is particularly useful if the short-to-ground of the output node can occur while the supply voltage ($V_{DD}$) is allowed to increase.

In general, control circuit 400 operates the same as control circuit 200 of FIG. 2. Nevertheless, control circuit 400 can be designed with different tripping points in mind, i.e., those tailored to the power limiting function. This protection circuit includes three additional transistors M17-M19 to further develop the feedback current provided to the gate of PMOS transistor M1.

As before, PMOS transistor M11 detects the output current $I_1$ as current $I_1/X_1$. An additional power supply dependent current $I_2$ is provided via PMOS transistor M19. The current $I_2$ is directly dependent on the power supply voltage $V_{DD}$ such that any increase in that voltage causes $I_2$ to increase. The combined current $(I_1/X_1)+I_2$ is mirrored by the current mirror formed using transistors M12-M15. Consequently, the feedback current is now $((I_1/X_1)+I_2)X_2$.

In operation, as the supply voltage $V_{DD}$ increases, current $I_2$, and thus the total feedback current, increases accordingly. This increased current charges up node $g_1$, pushing the gate voltage of PMOS transistor M1 higher, and thus operating to cause M1 to source less current. By operation of this protection circuit, the power of the circuit under protection is effectively clamped.

Figure 5:
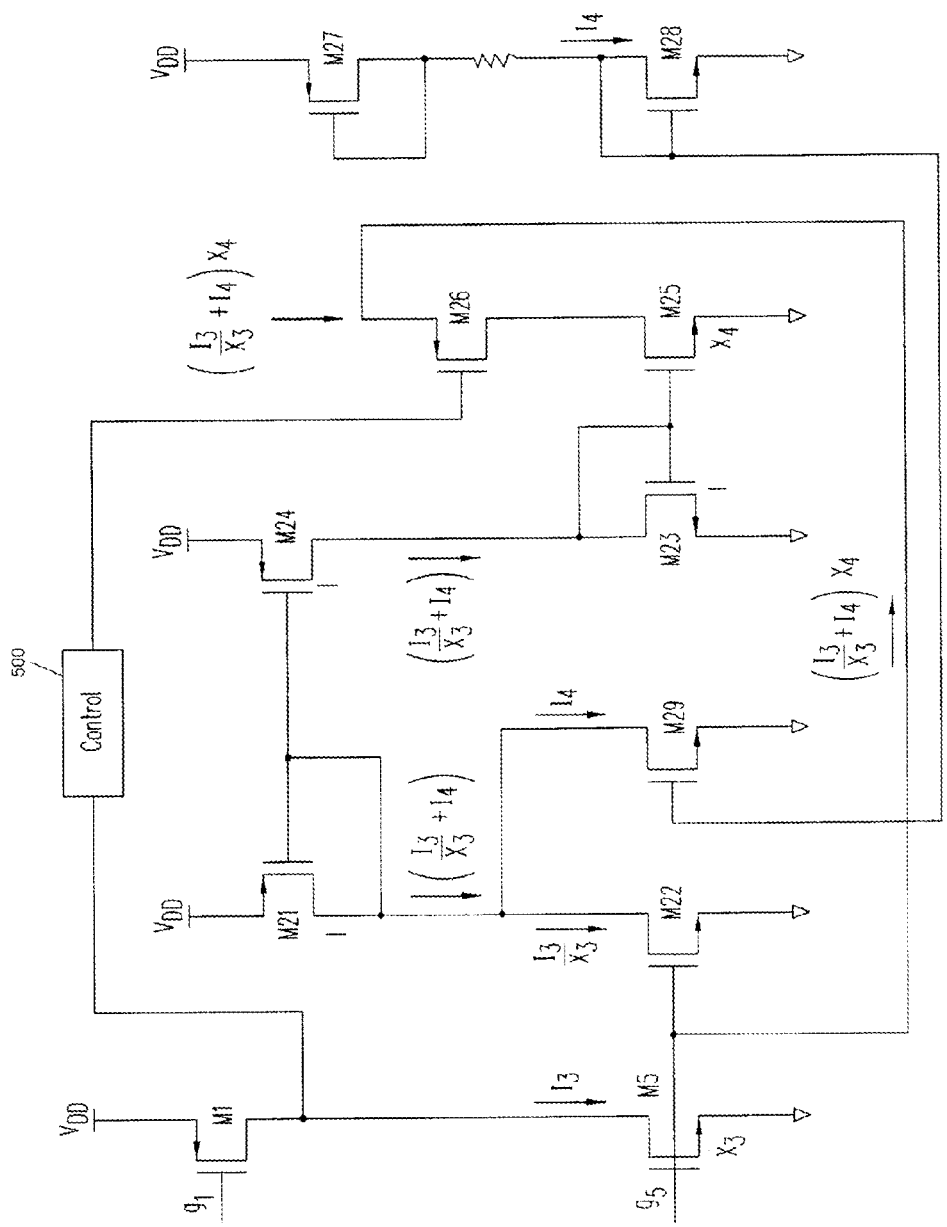
FIG. 5 is a schematic diagram illustrating an example of another power limiting protection circuit for use with the circuit of FIG. 1.

Finally, FIG. 5 illustrates still another protection circuit based on the circuit design of FIG. 3. As with the protection circuit of FIG. 3, this circuit is designed to provide circuit protection in the event the output node is shorted to the power supply rail, and NMOS transistor M5 is forced to sink a large amount of current. However, instead of providing current limiting protection, the circuit of FIG. 5 is a power limit circuit for protecting NMOS transistor M5, and potentially other circuit components that might be damaged from the high heat associated with an unplanned spike in power consumption. Power limit protection is particularly useful if the short-to-supply of the output node can occur while the supply voltage ($V_{DD}$) is allowed to increase.

In general, control circuit 500 operates the same as control circuit 300 of FIG. 3. Nevertheless, control circuit 500 can be designed with different tripping points in mind, i.e., those tailored to the power limiting function. This protection circuit includes three additional transistors M27-M29 to further develop the feedback current drawn from the gate of NMOS transistor M5.

As with the protection circuit of FIG. 3, NMOS transistor M22 detects the sink current $I_3$ as current $I_3/X_3$. An additional power supply dependent current $I_4$ is provided via NMOS transistor M29 (and developed through transistors M27 and M28. The current $I_4$ is directly dependent on the power supply voltage $V_{DD}$ such that any increase in that voltage causes $I_4$ to increase. The combined current $(I_3/X_3)+I_4$ is mirrored by the current mirror formed using transistors M21 and M23-M25. Consequently, the feedback current drawn from node $g_5$ is now $((I_3/X_3)+I_4)X_4$.

In operation, as the supply voltage $V_{DD}$ increases, current $I_4$, and thus the total feedback current drawn from node $g_5$, increases accordingly. This increased current discharges node $g_5$, pushing the gate voltage of NMOS transistor M5 lower, and thus operating to cause M5 to sink less current. By operation of this protection circuit, the power of the circuit under protection is effectively clamped.

The protection circuits of FIGS. 2-5 are typically integrated with the circuit or circuits they are designed to protect. However, in some embodiments, the protection circuits can be implemented as separate integrated circuits used in conjunction with the circuits to be protected. In still other examples, the various disclosed control circuits can be combined, or a single circuit can be used to control multiple protection circuits. Additionally, the example protected circuit of FIG. 1, is merely one possibility of numerous different types of circuits that can make use of the disclosed protection circuits.

Numerous variations and modifications to the circuits described in FIGS. 2-5 will be known to those having ordinary skill in the art. For example, one or more of the resistors illustrated (or other needed circuit components) can be implemented using a variety of programmable or trimable devices, or both. Similarly, the disclosed devices and techniques are not necessarily limited by any transistor, inductor, resistor, or capacitor sizes, capacities, values, or by voltage levels disclosed herein. Moreover, implementation of the disclosed devices and techniques is not limited by CMOS technology, and thus implementations can utilize NMOS, PMOS, and various bipolar or other semiconductor fabrication technologies. While the disclosed devices and techniques have been described in light of the embodiments discussed above, one skilled in the art will also recognize that certain substitutions may be easily made in the circuits without departing from the teachings of this disclosure. For example, a variety of logic gate structures may be substituted for those shown, and still preserve the operation of the circuit, in accordance with DeMorgan's law. Also, many circuits using NMOS transistors may be implemented using PMOS transistors instead, as is well known in the art, provided the logic polarity and power supply potentials are reversed. In this vein, the transistor conductivity type (i.e., N-channel or P-channel) within a CMOS circuit may be frequently reversed while still preserving similar or analogous operation. Other combinations of output stages are possible to achieve similar functionality.

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. Such shorthand phrases for describing circuit operation used herein are more efficient to communicate details of circuit operation, particularly because the schematic diagrams in the figures clearly associate various signal names with the corresponding circuit blocks and node names.

FIGS. 6A-6C show an operational amplifier buffer and timing diagrams. FIG. 6B shows a timing diagram for an input signal at input node INP of the operational amplifier in FIG. 6A.

FIG. 6C shows an output signal at OUT of the operational amplifier without short-circuit protection. At time=ta, the operational amplifier acts like it is shorted to ground. At time=tb, the operational amplifier acts like it is shorted to AVDD. These short conditions are undesirable because the circuit will burn power and generate heat unnecessarily.

FIG. 6D shows an output signal at OUT of the operational amplifier with a previous short-circuit protection circuit. Note the relatively slow slew rate at OUT relative to the input signal. This is also not desirable.

FIG. 7A-7C show a short-circuit protection circuit for an operational amplifier. See FIG. 2 for an operational amplifier circuit, PMOS driver. The short-circuit protection circuitry improves slew rate for heavy capacitor load. This circuitry handles the situation with the output is shorted to ground.

The short circuit protection (SCP) circuitry in FIGS. 7A-7C is used to implement control circuit 200 in FIG. 2. Inputs to the SCP control circuitry are OUT and g1, and an output is SCPa. The circuitry provides short circuit protection. The protection circuit has three blocks, block 1a, block 2a, and block 3a. FIG. 7A shows circuitry of block 1a. Block 1a detects the output voltage level at OUT. When OUT rises above two diode drops (2*VT), the output of block 1a goes to ground.

FIG. 7B shows block 2a. Figure Block 2a detects a voltage level of the gate of driver g1 (see FIG. 4). FIG. 7C shows a block 3, which includes block 1a and block 2a. Block 3a provides a short circuit protection signal (SCP) generation circuit, generating a SCPa signal.

Block 1a includes an inverter having an input and output. Two diode-connected transistors (which provides a 2*VT drop) are connected between the input of the inverter and ground. A current source and transistor are connected between power and the input of the inverter. A gate of the transistor is connected the output of the operational amplifier. An output of the inverter will be will be a logic low with OUT is greater than 2*VT.

Block 2a includes a first inverter having a first input and first output, and a second inverter having a second input and second output. A transistor is connected between the first input and ground; a gate of the transistor is connected to g1 (which is also connected to the gate of transistor M1 in FIG. 2). A current source is connected between power and the first input. Between the first and second inverters is a delay block, which provides a delayed signal output from the first inverter to the second inverter. At the output of block 2a is a g1b_delay signal.

Outputs from block 1a and 2a are input to block 3a to generate an output from the short circuit protection circuit. Block 3a includes logical circuitry (e.g., a logic gate) that takes as inputs and generates an output SCPa signal.

FIGS. 8A-8C show the circuit block when output is shorted to power (e.g., AVDD). See FIG. 3 for an operational amplifier circuit, NMOS driver. This circuitry is analogous to the circuits in FIGS. 7A-7C, but for the NMOS driver. A operational amplifier circuit can include the circuitry in for the PMOS driver (FIG. 7A-7C) or NMOS driver (FIGS. 8A-8C), or both.

The short circuit protection (SCP) circuitry in FIGS. 8A-8C is used to implement control circuit 300 in FIG. 3. Inputs to the SCP control circuitry are OUT and g5, and an output is SCPb. The circuitry provides short circuit protection to power. The protection circuit has three blocks, block 1b, block 2b, and block 3b. FIG. 8A shows circuitry of block 1b. FIG. 8B shows circuitry of block 1b.

Block 1b includes an inverter having an input and output. Two diode-connected transistors (which provides a 2*VT drop) are connected between the input of the inverter and power. A current source and transistor are connected between ground and the input of the inverter. A gate of the transistor is connected the output of the operational amplifier. An output of the inverter will be will be a logic low with OUT is less than 2*VT.

Block 2b includes a first inverter having a first input and first output, and a second inverter having a second input and second output. A transistor is connected between the first input and power; a gate of the transistor is connected to g5 (which is also connected to the gate of transistor M5 in FIG. 3). A current source is connected between ground and the first input. Between the first and second inverters is a delay block, which provides a delayed signal output from the first inverter to the second inverter. At the output of block 2b is a g5b_delay signal.

Outputs from block 1b and 2b are input to block 3b to generate an output from the short circuit protection circuit. Block 3b includes logical circuitry (e.g., a logic gate) that takes as inputs (i.e., two inputs) and generates an output SCPb signal. For example, in an implementation, block 3b includes logic such as NAND, NOR, XOR, AND, or OR, and combinations of these. These gates can be 2-input gates.

The delay block described above in FIGS. 7B and 8B can be implemented using active or passive delay circuit techniques. For example, the delay can be implemented using a resistance and capacitance (RC) delay circuit. The resistances and capacitances may be formed from parasitic resistances and capacitances. As another example, the delay can be implemented using an inverter chain, where the inverters are sized to give the desired delay. The delay block can include a combination of active and passive techniques. For example, the delay block can include inverters and resistances and capacitances.

The delay block in FIGS. 7B and 8B provides a noninverting delay, such that a signal output from the delay block has the same polarity as the signal being input. In other implementations, the delay block can provide a inverting delay, and additional circuitry, such as an inverter or other logic can change the polarity of the logic if needed.

FIG. 9A shows the operational amplifier buffer and control circuitry. The control circuitry is as shown in FIGS. 7A-7C and PMOS driver of FIG. 2. FIG. 9B shows the circuitry, where the output has been shorted to ground. FIG. 9C shows timing waveforms where the output is shorted to ground.

FIG. 10A shows the operational amplifier buffer and control circuitry. The control circuitry is as shown in FIGS. 7A-7C and PMOS driver of FIG. 2. FIG. 10B shows the circuitry, where the output has input step response, normal circuit operation, short circuit like operation. FIG. 10C shows timing waveforms where slew rate from 0 volts to power, AVDD.

The operational amplifier circuit buffer with short circuit circuits operates effectively under the condition of a heavy capacitor or capacitive load. Referring to timing diagrams in FIG. 9C, at time t=ta, either output is really shorted to ground or input has step function from 0 volts, this operational amplifier behaves as if a short circuit to ground. The internal circuitry starts to detect driver gate and output voltage. After a certain time delay to t=td (e.g., due to the delay block and g1b_delay signal), output voltage (OUT) will be detected.

If output voltage is still less than 2*VT, then this condition will be considered as output shorted to ground. Signal SCPa will be high. Signal SCPa indicates output is shorted to ground. This condition and corresponding waveform are shown in FIGS. 9A-9C.

If output voltage is greater than 2*VT, then this condition will be considered as normal operation condition such as slew rate or load transient condition. Signal SCPa will be low. This condition and corresponding waveform are shown in FIGS. 10A-10C.

Signal SCPa controls the PMOS driver current.

FIG. 11A shows the operational amplifier buffer and control circuitry. The control circuitry is as shown in FIGS. 8A-8C and NMOS driver of FIG. 3. FIG. 11B shows the circuitry, where the output has been shorted to power. FIG. 11C shows timing waveforms where the output is shorted to power.

FIG. 12A shows the operational amplifier buffer and control circuitry. The control circuitry is as shown in FIGS. 8A-8C and NMOS driver of FIG. 3. FIG. 12B shows the circuitry, where the output has input step response, real circuit operation, and short circuit like operation. FIG. 12C shows timing waveforms where the slew rate from power AVDD to 0 volts.

At time t=ta, either the output is really shorted to AVDD or input has step function from AVDD. The operational amplifier behaves as if a short circuit to AVDD. The internal circuit starts to detect driver gate and output voltage. After a certain time delay to t=td (e.g., due to the delay block and g5b_delay signal), the output voltage (OUT) will be detected.

If the output voltage is still greater than AVDD−2*VT, then this condition will be considered as output has been shorted to AVDD. The signal SCPb will be high. SCPb indicates output is shorted to AVDD. The waveform is shown in FIG. 11C.

If the output voltage is less than AVDD−2*VT, then this condition will be considered as normal operation condition such as slew rate or load transient condition. The signal SCPb will be low. The waveform is shown in FIG. 12C.

Signal SCPb controls the NMOS driver current.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A circuit comprising:
a control circuit configured to detect at least one of a short-to-ground condition or a short-to-supply condition at an output node;
a first transistor coupled to the control circuit and controlled by the control circuit for selectively applying a feedback current to a gate electrode of a second transistor, wherein the gate electrode of the second transistor is coupled to the control circuit;
a third transistor having a gate electrode coupled to the gate electrode of the second transistor, wherein the third transistor is configured to detect a detected current flowing through the second transistor; and
a current mirror coupled to the first transistor and the third transistor, wherein the current mirror produces the feedback current based on the detected current.

2. A circuit comprising:
a control circuit configured to detect at least one of a short-to-ground condition or a short-to-supply condition at an output node;
a first transistor coupled to the control circuit and controlled by the control circuit for selectively applying a feedback current to a gate electrode of a second transistor;
a third transistor having a gate electrode coupled to the gate electrode of the second transistor, wherein the third transistor is configured to detect a detected current flowing through the second transistor; and
a current mirror coupled to the first transistor and the third transistor, wherein the current mirror produces the feedback current based on the detected current,
wherein the control circuit comprises:
a fourth transistor comprising a gate node coupled the gate electrode of the second transistor;
a first buffer, coupled to a source node of the fourth transistor; and
a second buffer, coupled between the first buffer and the first transistor.

3. A circuit comprising:
a control circuit configured to detect at least one of a short-to-ground condition or a short-to-supply condition at an output node;
a first transistor coupled to the control circuit and controlled by the control circuit for selectively applying a feedback current to a gate electrode of a second transistor;
a third transistor having a gate electrode coupled to the gate electrode of the second transistor, wherein the third transistor is configured to detect a detected current flowing through the second transistor; and
a current mirror coupled to the first transistor and the third transistor, wherein the current mirror produces the feedback current based on the detected current,
wherein the control circuit comprises:
a fourth transistor comprising a gate node coupled the gate electrode of the second transistor;
a first buffer, coupled to a source node of the fourth transistor;
a delay element, coupled to the first buffer; and
a second buffer, coupled between the delay element and the first transistor.

4. The circuit of claim 2 wherein the control circuit comprises at least two diode-connected transistors coupled to a third inverter.

5. The circuit of claim 4 wherein the control circuit comprises a control transistor having a gate electrode coupled to the output node, and the control transistor is coupled to the at least two diode-connected transistors.

6. The circuit of claim 1 wherein the second transistor has a second transistor width to length (w/l) ratio, the third transistor has a third transistor w/l ratio, and the second transistor w/l ratio is greater than the third transistor w/l ratio.

7. The circuit of claim 1 wherein the current mirror includes a plurality of transistors, the third transistor has a third transistor w/l ratio, and at least one of the plurality of transistors has a transistor w/l ratio the same as the third transistor w/l ratio.

8. The circuit of claim 1 wherein the current mirror includes a plurality of transistors, the second transistor has a second transistor w/l ratio, and at least one of the plurality of transistors has a transistor w/l ratio greater than the second transistor w/l ratio.

9. The circuit of claim 1 wherein the second transistor is a PMOS transistor coupled between a power supply and the output node, and wherein the feedback current increases a voltage on the gate electrode of the second transistor when the short-to-ground condition occurs at the output node.

10. The circuit of claim 1 wherein the second transistor is an NMOS transistor coupled between the output node and ground, and wherein the feedback current decreases a voltage on the gate electrode of the second transistor when the short-to-supply condition occurs at the output node.

11. The circuit of claim 1 further comprising:
a protected circuit including the second transistor, wherein the protected circuit, the control circuit, the first transistor, the third transistor, and the current mirror are each included in a same integrated circuit.

12. The circuit of claim 11 wherein the protected circuit further comprises a class AB output stage.

13. The circuit of claim 2 further comprising:
a fifth transistor coupled in parallel with the third transistor and configured to provide a supply-dependent current, wherein the current mirror produces the feedback current based on the detected current and the supply-dependent current.

14. The circuit of claim 2 wherein the second transistor is a PMOS transistor coupled between a power supply and the output node, and wherein the feedback current increases a voltage on the gate electrode of the second transistor when the short-to-ground condition occurs at the output node to provide power limit protection to the second transistor.

15. The circuit of claim 2 wherein the second transistor is an NMOS transistor coupled between the output node and ground, and wherein the feedback current decreases a voltage on the gate electrode of the second transistor when the short-to-supply condition occurs at the output node to provide power limit protection to the second transistor.

16. The circuit of claim 1 wherein each of the first, second, and third transistors are MOSFETs.

17. A method comprising:
detecting one of a short-to-ground condition and a short-to-supply condition at an output node and outputting a first signal;
detecting a change in an input signal at an input node and after a delay, caused by a delay circuit, after the change in the input signal, outputting a second signal;
based on the first and second signals, selectively activating a feedback control transistor;
detecting a first current passing through a first transistor using a second transistor sized to be smaller than the first transistor;
mirroring the detected current using a plurality of transistors to form a feedback current; and
providing the feedback current to a gate electrode of the first transistor according to the selectively activating the feedback control transistor.

18. The method of claim 17 wherein the detecting comprises detecting a short-to-ground condition at the output node and wherein the first transistor is a PMOS transistor coupled between a supply rail and the output node, the method further comprising:
charging the gate electrode of the first transistor according to the feedback current.

19. The method of claim 17 wherein the detecting comprises detecting a short-to-supply condition at the output node and wherein the first transistor is an NMOS transistor coupled between the output node and ground, the method further comprising:
discharging the gate electrode of the first transistor according to the feedback current.

20. The method of claim 17 wherein a change in the input signal results in a delayed change in the second signal of the same polarity.

21. The circuit of claim 2 wherein the second transistor has a second transistor width to length (w/l) ratio, the third transistor has a third transistor w/l ratio, and the second transistor w/l ratio is greater than the third transistor w/l ratio.

22. The circuit of claim 2 wherein the current mirror includes a plurality of transistors, the third transistor has a third transistor w/l ratio, and at least one of the plurality of transistors has a transistor w/l ratio the same as the third transistor w/l ratio.

23. The circuit of claim 2 wherein the current mirror includes a plurality of transistors, the second transistor has a second transistor w/l ratio, and at least one of the plurality of transistors has a transistor w/l ratio greater than the second transistor w/l ratio.

24. The circuit of claim 2 wherein the second transistor is a PMOS transistor coupled between a power supply and the output node, and wherein the feedback current increases a voltage on the gate electrode of the second transistor when the short-to-ground condition occurs at the output node.

25. The circuit of claim 2 wherein the second transistor is an NMOS transistor coupled between the output node and ground, and wherein the feedback current decreases a voltage on the gate electrode of the second transistor when the short-to-supply condition occurs at the output node.

26. The circuit of claim 2 further comprising:
a protected circuit including the second transistor, wherein the protected circuit, the control circuit, the first transistor, the third transistor, and the current mirror are each included in a same integrated circuit.

27. The circuit of claim 26 wherein the protected circuit further comprises a class AB output stage.

28. The circuit of claim 3 wherein the control circuit comprises at least two diode-connected transistors coupled to a third inverter.

29. The circuit of claim 28 wherein the control circuit comprises a control transistor having a gate electrode coupled to the output node, and the control transistor is coupled to the at least two diode-connected transistors.

30. The circuit of claim 3 wherein the second transistor has a second transistor width to length (w/l) ratio, the third transistor has a third transistor w/l ratio, and the second transistor w/l ratio is greater than the third transistor w/l ratio.

31. The circuit of claim 3 wherein the current mirror includes a plurality of transistors, the third transistor has a third transistor w/l ratio, and at least one of the plurality of transistors has a transistor w/l ratio the same as the third transistor w/l ratio.

32. The circuit of claim 3 wherein the current mirror includes a plurality of transistors, the second transistor has a second transistor w/l ratio, and at least one of the plurality of transistors has a transistor w/l ratio greater than the second transistor w/l ratio.

33. The circuit of claim 3 wherein the second transistor is a PMOS transistor coupled between a power supply and the output node, and wherein the feedback current increases a voltage on the gate electrode of the second transistor when the short-to-ground condition occurs at the output node.

34. The circuit of claim 3 wherein the second transistor is an NMOS transistor coupled between the output node and ground, and wherein the feedback current decreases a voltage on the gate electrode of the second transistor when the short-to-supply condition occurs at the output node.

35. The circuit of claim 3 further comprising:
a protected circuit including the second transistor, wherein the protected circuit, the control circuit, the first transistor, the third transistor, and the current mirror are each included in a same integrated circuit.

36. The circuit of claim 35 wherein the protected circuit further comprises a class AB output stage.

37. The circuit of claim 3 further comprising:
a fifth transistor coupled in parallel with the third transistor and configured to provide a supply-dependent current, wherein the current mirror produces the feedback current based on the detected current and the supply-dependent current.

38. The circuit of claim 3 wherein the second transistor is a PMOS transistor coupled between a power supply and the output node, and wherein the feedback current increases a voltage on the gate electrode of the second transistor when the short-to-ground condition occurs at the output node to provide power limit protection to the second transistor.

39. The circuit of claim 3 wherein the second transistor is an NMOS transistor coupled between the output node and ground, and wherein the feedback current decreases a voltage on the gate electrode of the second transistor when the short-to-supply condition occurs at the output node to provide power limit protection to the second transistor.

40. The circuit of claim 3 wherein each of the first, second, and third transistors are MOSFETs.

41. The method of claim 17 wherein the selectively activating a feedback control transistor is performed by a control circuit, and the control circuit comprises
a third transistor, comprising a gate node coupled to a gate node of the first transistor;
a first buffer, coupled to a source node of the third transistor; and
a second buffer, coupled between the first buffer and the feedback control transistor.

42. The method of claim 17 wherein the selectively activating a feedback control transistor is performed by a control circuit, the feedback control transistor is coupled to a gate node of the first transistor and a gate node of the second transistor, and the control circuit comprises
a third transistor, comprising a gate node coupled to the gate node of the first transistor;
a first buffer, coupled to a source node of the third transistor; and
a second buffer, coupled between the first buffer and the feedback control transistor.

* * * * *